United States Patent [19]

Hojo et al.

[11] Patent Number: 5,397,730
[45] Date of Patent: Mar. 14, 1995

[54] METHOD OF MAKING A HIGH EFFICIENCY HORIZONTAL TRANSFER SECTION OF A SOLID STATE IMAGER

[75] Inventors: Junichi Hojo; Toshiaki Wakayama, both of Kanagawa, Japan

[73] Assignee: Sony Corporation, Tokyo, Japan

[21] Appl. No.: 98,653

[22] Filed: Jul. 15, 1993

Related U.S. Application Data

[63] Continuation of Ser. No. 835,323, Feb. 14, 1992, abandoned.

[30] Foreign Application Priority Data

Feb. 14, 1991 [JP] Japan ................... 3-043019

[51] Int. Cl.⁶ ............................. H01L 21/74
[52] U.S. Cl. ......................... 437/53; 437/28; 148/DIG. 157
[58] Field of Search ............... 257/216, 218, 219, 221, 257/223, 229, 230; 437/2, 3, 50, 53, 950, 956, 958; 148/DIG. 13, DIG. 39, DIG. 144, DIG. 145, DIG. 157

[56] References Cited

U.S. PATENT DOCUMENTS

| | | | |
|---|---|---|---|
| 4,742,027 | 5/1988 | Blanchard et al. | 437/2 |
| 4,831,426 | 5/1989 | Kimata et al. | 437/53 |
| 5,114,833 | 5/1992 | Erhardt | 437/53 |
| 5,118,631 | 6/1992 | Dyck et al. | 437/53 |

FOREIGN PATENT DOCUMENTS

| | | |
|---|---|---|
| 0278565 | 8/1988 | European Pat. Off. |
| 0354619 | 2/1990 | European Pat. Off. |
| 0405401 | 1/1991 | European Pat. Off. |
| 57-32179 | 2/1982 | Japan. |
| 62-125668 | 6/1987 | Japan. |
| 63-188971 | 8/1988 | Japan ................... 257/218 |
| 1-138757 | 5/1989 | Japan ................... 437/53 |

OTHER PUBLICATIONS

English translation of 1-138757 is attached.

*Primary Examiner*—Brian E. Hearn
*Assistant Examiner*—Chandra Chaudhari
*Attorney, Agent, or Firm*—Hill, Steadman & Simpson

[57] ABSTRACT

In a horizontal transfer section of a solid state imager, a horizontal transfer efficiency can be improved while other element sections are prevented from being substantially affected. In a solid state imager having a horizontal transfer section comprised of a well-region of a second conductivity type formed on the surface of a semiconductor substrate of a first conductivity type and a signal charge transfer region formed on the surface of the well-region of the second conductivity type, the well-region is formed completely in a depletion state by the implantation of impurities into this well-region. The horizontal transfer efficiency is thus improved.

7 Claims, 3 Drawing Sheets

METHOD OF MAKING A HIGH EFFICIENCY HORIZONTAL TRANSFER SECTION OF A SOLID STATE IMAGER

This is a continuation of application Ser. No. 07/835,323, filed Feb. 14, 1992, now abandoned.

BACKGROUND OF THE INVENTION

1. Field of the Invention

The present invention generally relates to solid state imagers and, more particularly, to a horizontal transfer section of a solid state imager in which charge transfer efficiency of its horizontal transfer section is improved.

2. Description of the Prior Art

FIG. 1 of the accompanying drawings shows an arrangement of a CCD (charge-coupled device) solid state imager of, for example, an interline transfer type as an example of conventional solid state imagers.

As shown in FIG. 1, an image pickup section 3 is comprised of a plurality of sensitive units (pixels) 1 arrayed in the horizontal and vertical directions in a two-dimensional manner so as to store signal charges corresponding to the amount of an incident light. A vertical shift register (vertical transfer sections) 2 is provided for transferring signal charges read-out from these sensitive sections 1 at every vertical column in the vertical direction. In the image pickup section 3, the sensitive section 1 is made of, for example, a photodiode, and the vertical shift register 2 is made of a CCD. Signal charges transferred to the vertical shift register 2 are sequentially transferred to a horizontal shift register (i.e., horizontal transfer section) 4 by an amount corresponding to one scanning line during a part of the horizontal blanking period. Signal charges corresponding to the amount of one scanning line are sequentially transferred by the horizontal shift register 4 in the horizontal direction. An output circuit section 5 is provided at the end of the horizontal shift register 4. This output circuit section 5 is formed of a floating diffusion amplifier (i.e., FDA) to convert a signal charge transferred thereto into an electrical signal.

Of this kind of CCD solid state imager, particularly in a device utilizing a semiconductor substrate of a first conductivity type, e.g., N type, respective elements are provided on a P-well region. This P-well region is formed in a depletion state so as to function as an overflow barrier in order to remove a so-called blooming in the image sensor section. As to the horizontal shift register 4, in order to match the drive condition of a transfer clock for driving the horizontal transfer section, i.e., in order to match the voltage level (e.g., voltages of 5 V and 0 V) of a horizontal transfer clock, a potential of a P well-region is decreased by the implantation of boron (B) therein.

In this case, however, since the potential of the P well-region is lowered or made shallow by the implantation of boron (B) to the P well-region, it is to be understood that, when the horizontal transfer clock is "L" (low) in level, the P well-region is not formed in a depletion state. As a result, the potential of the P well-region becomes neutral, thus resulting in the charge transfer efficiency of the horizontal transfer section being deteriorated.

OBJECTS AND SUMMARY OF THE INVENTION

It is an object of the present invention to provide an improved solid state imager in which the aforesaid shortcomings and disadvantages of the prior art can be eliminated.

It is another object of the present invention to provide a solid state imager in which a charge transfer efficiency in the horizontal transfer can be improved without substantially exerting a bad influence on other elements.

In order to achieve the aforesaid objects, according to an aspect of the present invention, in a solid state imager having a horizontal transfer section comprised of a well-region of a second conductivity type formed on the surface of a semiconductor substrate of a first conductivity type and a signal charge transfer region formed on the surface of the well-region of the second conductivity type, this well-region of the second conductivity type is formed completely in a depletion state by the implantation of impurities onto the above well-region.

In the horizontal transfer section of the solid state imager according to the present invention, in order to match the driving condition of the transfer clock, the potential is made shallow by the implantation of boron onto the well-region of the second conductivity type. Then the well-region is formed completely in a depletion state by the implantation of impurities onto this well-region. Energy of the ion implantation is selected to be high so as not to substantially affect the signal charge transfer region. Since the well-region is formed completely in a depletion state, the charge transfer efficiency in the horizontal transfer can be increased. Furthermore, since the mask for the implantation of impurities is used commonly when the donor implantation is carried out, the improvement of the charge transfer efficiency can be realized only by adding the ion implantation process.

The above and other objects, features, and advantages of the present invention will become apparent from the following detailed description of an illustrative embodiment thereof to be read in conjunction with the accompanying drawings.

DETAILED DESCRIPTION OF PREFERRED EMBODIMENT

An embodiment of the present invention will be described in detail with reference to the drawings.

Figure 2:
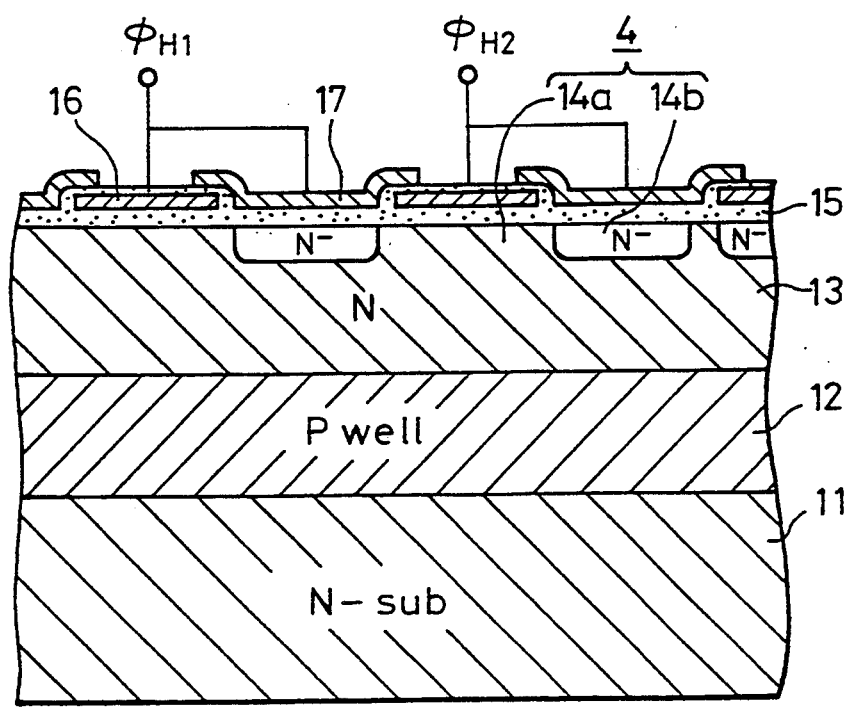
FIG. 2 is a cross-sectional view of a horizontal transfer section of a solid state imager according to an embodiment of the present invention.

FIG. 2 shows a cross-sectional view of a structure of a horizontal transfer section in a solid state imager according to the present invention.

Figure 1:
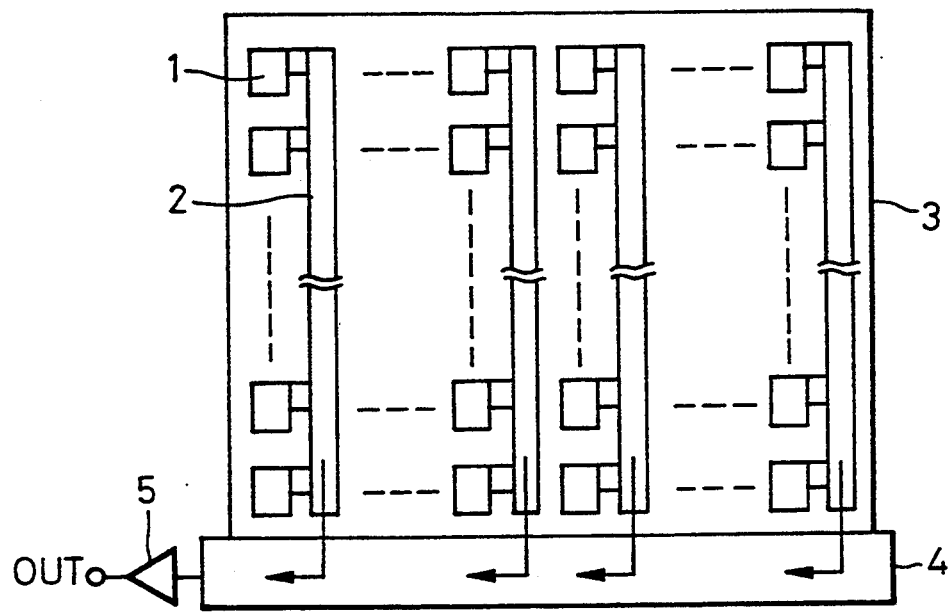
FIG. 1 is a plan view of a structure of a conventional CCD solid state imager of an interline transfer type.

Referring to FIG. 2, on the surface of a semiconductor substrate 11 of a first conductivity type, e.g., N type, there is formed a well-region of a second conductivity type, i.e., P type (hereinafter simply referred to as a P well-region) 12, and an N type region 13 is formed on the surface of the P well-region 12. A horizontal shift register 4 (see FIG. 1) is comprised of a signal charge storage region 14a of an N type, a signal charge transfer region 14b of an N- type (both being formed on the surface of the N type region 13), a storage gate electrode 16 and a transfer gate electrode 17, which are formed on the regions 14a and 14b through an insulating layer 15 made of a silicon oxide layer (SiO$_2$ layer) 15. In the horizontal shift register 4, the adjacent storage gate electrode 16 and transfer gate electrode 17 form a pair and are supplied with two-phase transfer clocks ΦH1 and ΦH2 to thereby transfer the signal charges in the horizontal direction.

Figure 3:
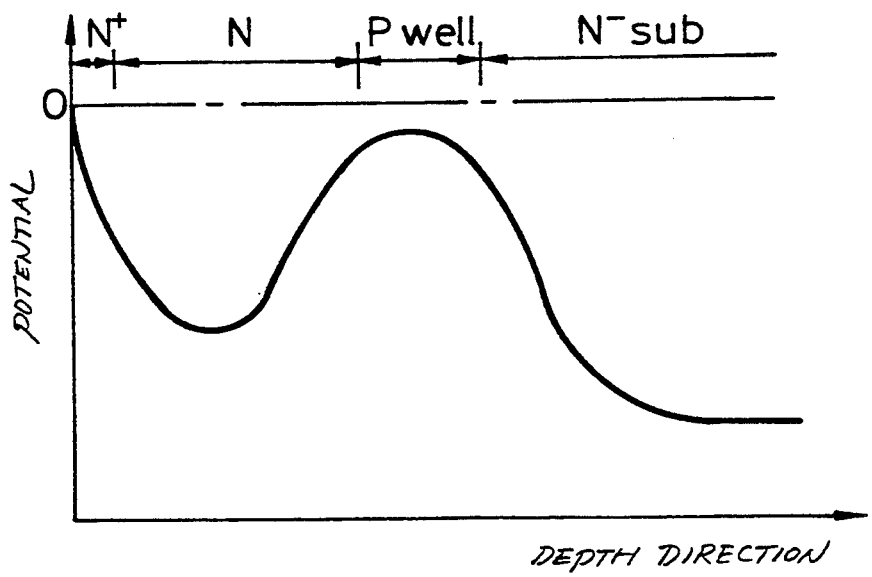
FIG. 3 is a diagram of potentials in respective regions before the implantation of boron.
Figure 4:
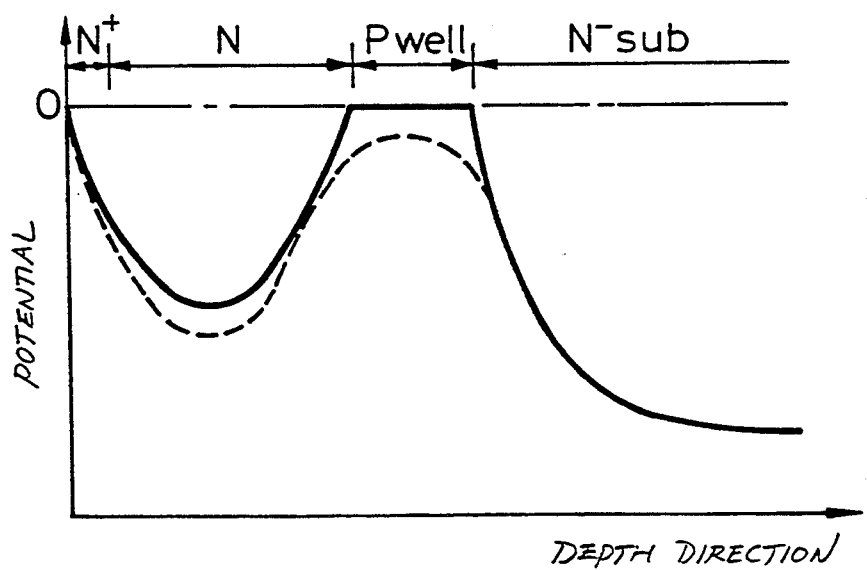
FIG. 4 is a diagram of potentials in respective regions after the implantation of boron.

In order to match the driving condition by the two-phase clocks ΦH1 and ΦH2, that is, in order to enable the transfer driving by the transfer clocks ΦH1 and ΦH2 of two values in which the "L" level is 0 V and the "H" level is 5 V, the potential is lowered or made shallow by the implantation of boron (B) to the P well-region 12. FIG. 3 shows a diagram of potentials of respective regions before the implantation of boron and FIG. 4 shows a diagram of potentials of respective regions after the implantation of boron, respectively. A broken line in FIG. 4 shows the potential before the implantation of boron in FIG. 3. As is clear from FIG. 4, by the implantation of boron to the P well-region 12, the potential becomes shallow over the whole region, and particularly the potential of the P well-region 12 becomes neutral (neutral region).

Figure 5:
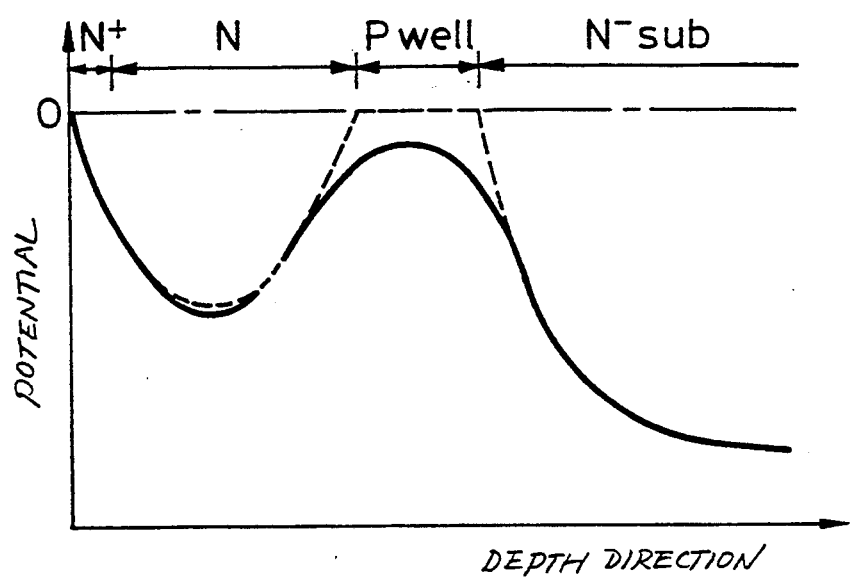
FIG. 5 is a diagram of potentials in respective regions after the implantation of donors.

After the implantation of boron, the P well-region 12 is further implanted with a donor (donor impurity) of energy which is selected substantially so as not to exert a bad influence on other element sections, such as the transfer region or the like. When the donor is implanted, a mask through which the boron is already implanted is used commonly. By implanting the high-energy donor into the P well-region 12, as shown in FIG. 5, the P well-region 12 can be formed completely in a depletion state, while substantially maintaining the potential of the N type region 13 at the potential shown by the solid line in FIG. 4. In that case, in order to prevent the potential of the transfer regions and so on formed on the surface of the N type region 13 from being made deep, the dose amount of donor impurity must be optimized.

Incidentally, a broken line in FIG. 5 shows a potential after the implantation of boron in FIG. 4.

As described above, according to the present invention, since the P well-region is placed completely in a depletion state by the implantation of a donor whose energy is selected high so as not to exert a bad influence upon other element sections, the charge transfer efficiency in the horizontal transfer can be improved while other element sections are substantially prevented from being affected. Furthermore, since the mask used for the implantation of boron is used commonly upon implantation of a donor impurity, the improvement of the charge transfer efficiency can be realized only by adding the ion implantation process.

Having described the preferred embodiment of the invention with reference to the accompanying drawings, it is to be understood that the invention is not limited to that precise embodiment and that various changes and modifications thereof could be effected by one skilled in the art without departing from the spirit or scope of the invention as defined in the appended claims.

What is claimed is:

1. A method for constructing a horizontal transfer section of a solid state image sensor, comprising the steps of:
    providing a substrate of a first conductivity type;
    providing a well-region of a second conductivity type opposite the first conductivity type on said substrate;
    providing a charge transfer region of said first conductivity type on the well-region;
    providing an insulating layer on said charge transfer region;
    providing a first set of electrodes on the insulating layer and each having a connection for supply with a first drive pulse;
    providing a second set of electrodes on said insulating layer with each having a connection for supply with a second drive pulse;
    subjecting said well-region to a first impurity implantation to render a potential of the well-region shallower; and
    then subjecting the well-region to a second impurity implantation to form a depletion state therein while maintaining a potential of the charge transfer region.

2. A method according to claim 1 wherein said first impurity implantation employs boron.

3. A method according to claim 1 wherein said second impurity implantation employs a donor impurity of an energy selected such that the well-region has its potential changed but the potential of the charge transfer region is not affected.

4. A method according to claim 1 wherein said first impurity implantation changes a potential of the well-region to a neutral potential.

5. A method according to claim 1 in which said second impurity implantation forms said well-region in said depletion state by an ion implantation.

6. A method according to claim 1 including the step of providing said first conductivity type as n-type and said second conductivity type as p-type.

7. A method according to claim 1 wherein said first and second impurity implantations are performed by using a mask.

* * * * *